United States Patent
Choi et al.

(10) Patent No.: US 12,550,703 B2
(45) Date of Patent: Feb. 10, 2026

(54) OPTICAL DEVICE PACKAGE PREPARATION METHOD AND OPTICAL DEVICE PACKAGE

(71) Applicant: LIPAC CO., LTD., Seoul (KR)

(72) Inventors: Seong Wook Choi, Seoul (KR); Dong Woo Park, Seoul (KR); Young June Park, Seoul (KR)

(73) Assignee: LIPAC CO., LTD., Seoul (KR)

( * ) Notice: Subject to any disclaimer, the term of this patent is extended or adjusted under 35 U.S.C. 154(b) by 391 days.

(21) Appl. No.: 18/029,330

(22) PCT Filed: Sep. 28, 2021

(86) PCT No.: PCT/KR2021/013183
§ 371 (c)(1),
(2) Date: Mar. 29, 2023

(87) PCT Pub. No.: WO2022/071710
PCT Pub. Date: Apr. 7, 2022

(65) Prior Publication Data
US 2023/0369169 A1  Nov. 16, 2023

(30) Foreign Application Priority Data
Sep. 29, 2020  (KR) .......................... 10-2020-0126900

(51) Int. Cl.
| | |
|---|---|
| *H01L 23/48* | (2006.01) |
| *H01L 23/04* | (2006.01) |
| *H01L 23/29* | (2006.01) |
| *H01L 23/31* | (2006.01) |
| *H01L 23/498* | (2006.01) |
| *H01L 23/538* | (2006.01) |
(Continued)

(52) U.S. Cl.
CPC ............ *H01L 23/481* (2013.01); *H01L 23/04* (2013.01); *H01L 23/293* (2013.01); *H01L 23/31* (2013.01); *H01L 23/49816* (2013.01); *H01L 23/5386* (2013.01); *H01L 25/167* (2013.01); *H10F 39/806* (2025.01)

(58) Field of Classification Search
CPC ...... H01L 23/481; H01L 23/04; H10F 39/806
USPC .......................................................... 257/414
See application file for complete search history.

(56) References Cited

U.S. PATENT DOCUMENTS

2017/0131487 A1*  5/2017  Lee ..................... G02B 6/4206

FOREIGN PATENT DOCUMENTS

| KR | 10-2008-0081408 A | 9/2008 |
|---|---|---|
| KR | 10-2016-0058591 A | 5/2016 |
| KR | 10-2017-0055417 A | 5/2017 |
(Continued)

OTHER PUBLICATIONS

International Search Report for PCT/KR2021/013183 mailed Jan. 19, 2022 from Korean Intellectual Property Office.

*Primary Examiner* — Quoc D Hoang
(74) *Attorney, Agent, or Firm* — Paratus Law Group, PLLC

(57) ABSTRACT

There is provided a semiconductor package. The semiconductor package includes: a semiconductor chip; a mold configured to encapsulate the chip; a redistribution layer; and an optical device electrically connected to the chip through the redistribution layer. The mold is formed with an optical path passing through the mold, and light is input to or output from the optical device through the optical path.

16 Claims, 21 Drawing Sheets

(51) Int. Cl.
  *H01L 25/16* (2023.01)
  *H10F 39/00* (2025.01)

(56) References Cited

FOREIGN PATENT DOCUMENTS

KR  10-2018-0046912 A  5/2018
KR  10-2019-0084856 A  7/2019

* cited by examiner

Fig. 8
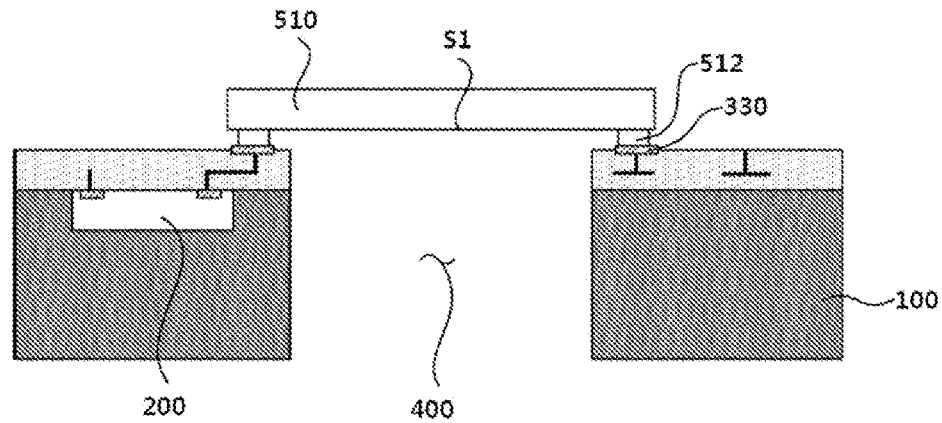
(a)
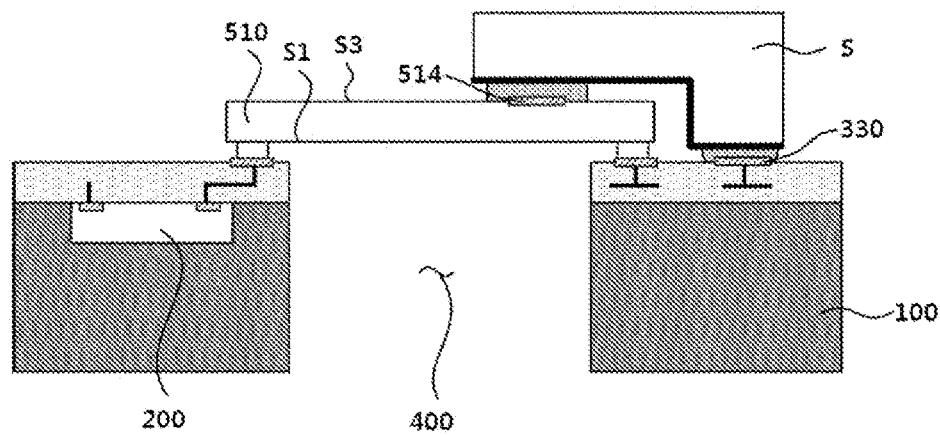
(b)
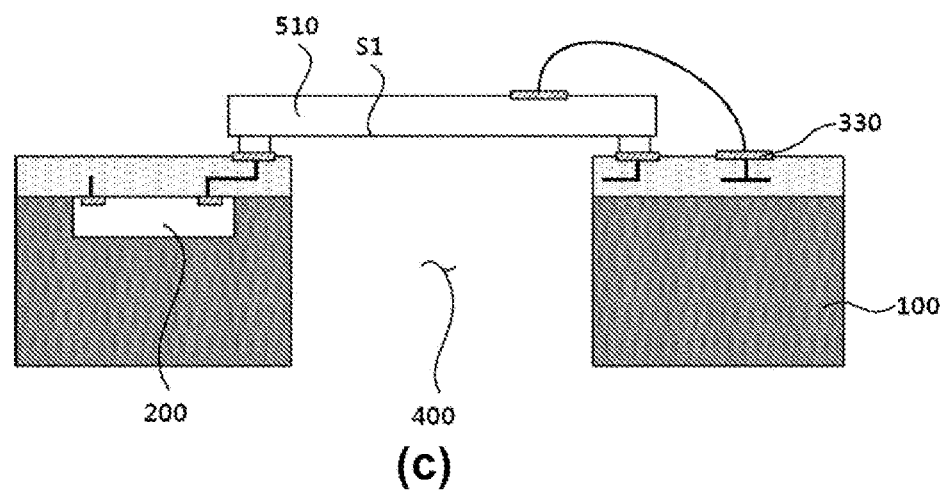
(c)

Fig. 20
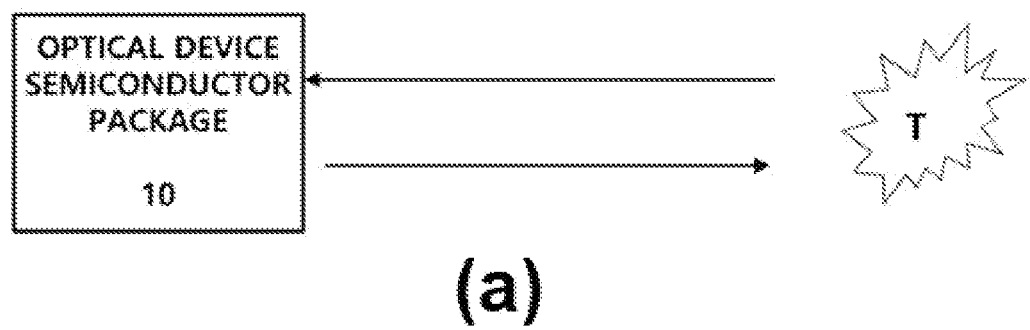
(a)
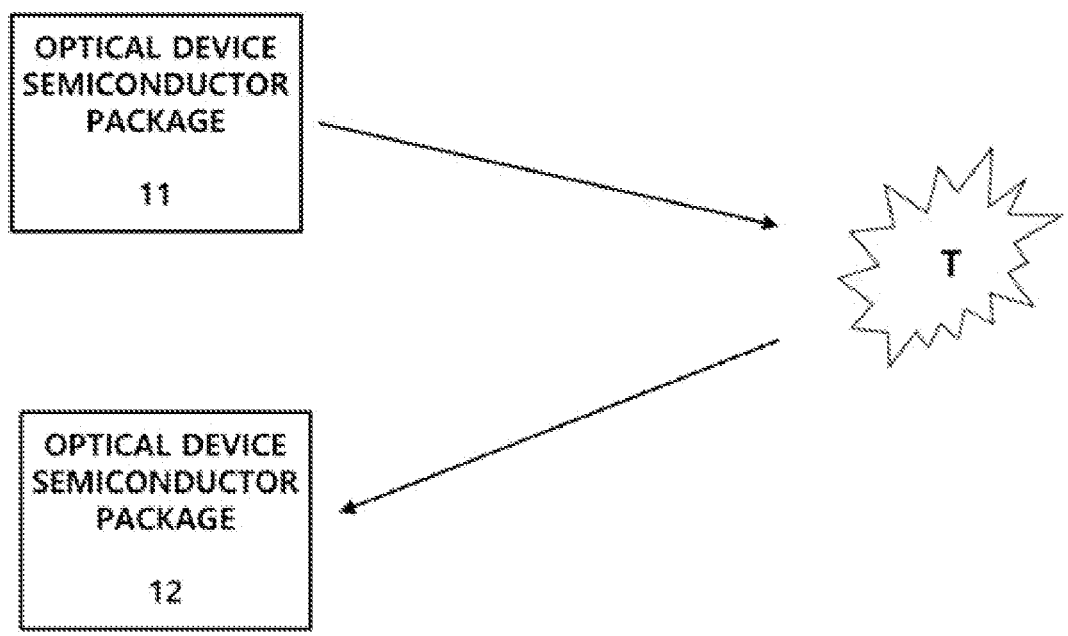
(b)

OPTICAL DEVICE PACKAGE PREPARATION METHOD AND OPTICAL DEVICE PACKAGE

CROSS-REFERENCE TO PRIOR APPLICATIONS

This application is a National Stage Patent Application of PCT International Patent Application No. PCT/KR2021/013183 (filed on Sep. 28, 2021) under 35 U.S.C. § 371, which claims priority to Korean Patent Application No. 10-2020-0126900 (filed on Sep. 29, 2020), which are all hereby incorporated by reference in their entirety.

BACKGROUND

The present technology relates to an optical device package preparation method and an optical device package.

Attempts to apply a package including an optical device to a mobile device are continuing. To this end, it is essential to lighten, thin, and miniaturize the optical device itself. However, since the related art uses a printed circuit board (PCB) as a substrate of an optical device package, there is a limitation in reducing a thickness thereof.

SUMMARY

In most currently used packages, since mold portions are composed of opaque portions, light is not transmitted. Further, a light-receiving device such as a complementary metal-oxide semiconductor (CMOS) image sensor (CIS) should be prepared in a structure that does not come into contact with other places during packaging, should have a sealed light-receiving portion, and serves as a filter while performing sealing by attaching glass to an opposite surface without a contact structure.

In the CIS, a portion packaged with glass is essential to protect a micro lens of the chip itself, and since the portion goes through a process of separately performing this packaging, and then performing packaging again by attaching the portion to a printed circuit board (PCB) or another place, a size inevitably increases and the process steps are complicated.

The embodiment is provided to address the above-described difficulties of the related art. That is, providing a method of forming a semiconductor package including an optical device with a thin thickness is one of the problems to be solved by the present technology, and providing a semiconductor package including an optical device having a thin thickness is one of the problems to be solved by the present technology.

A package preparation method according to the present technology includes: molding a chip using an encapsulating material; forming a redistribution layer; forming an optical path passing through the encapsulating material; and disposing one or more optical devices to be electrically connected through the redistribution layer, wherein the disposing of the optical devices is performed so that light is input to or output from the optical devices through the optical path.

According to one embodiment, the package preparation method may further include forming an external connection terminal electrically connected to the redistribution layer.

According to one embodiment, the molding may be performed using a light transmissive mold.

According to one embodiment, the molding may be performed using an epoxy mold compound (EMC).

According to one embodiment, the forming of the redistribution layer may include forming a conductive pattern, and forming an insulating layer, and the conductive pattern may be formed to bypass the optical path.

According to one embodiment, the forming of the optical path may be performed by removing the encapsulating material by any one method of laser boring, drilling, and etching.

According to one embodiment, the molding of the chip may be performed by molding a sacrificial member together at a position where the optical path is formed.

According to one embodiment, the forming of the optical path may be performed by removing the sacrificial member by any one method of laser boring, drilling, and etching.

According to one embodiment, the disposing of the optical devices may be performed by disposing one or more of a light-receiving device and a light-emitting device.

According to one embodiment, in the forming of the optical path, one or more of the light-receiving device and the light-emitting device disposed in the disposing of the optical devices may be formed to correspond to a light-receiving optical path and a light-emitting optical path.

According to one embodiment, the molding of the chip using the encapsulating material may be performed by molding a monitoring optical device and a transparent member forming an optical path of the monitoring optical device together.

According to one embodiment, the package preparation method may further include disposing a second semiconductor chip at an outer side of the package.

A package preparation method according to the present technology includes: molding a chip and an optical path member using an encapsulating material; forming a redistribution layer; and disposing one or more optical devices to be electrically connected through the redistribution layer, wherein the disposing of the optical devices is performed so that light is input to or output from the optical devices through the optical path member.

According to one embodiment, the package preparation method may further include forming an external connection terminal electrically connected to the redistribution layer.

According to one embodiment, the molding may be performed using an epoxy mold compound (EMC).

According to one embodiment, the forming of the redistribution layer may include forming a conductive pattern, and forming an insulating layer, and the conductive pattern may be formed to bypass the optical path.

According to one embodiment, the disposing of the optical devices may be performed by disposing one or more of a light-receiving device and a light-emitting device.

According to one embodiment, the molding of the optical path member may be performed by disposing the optical path member so that one or more of the light-receiving device and the light-emitting device may correspond to a light-receiving optical path and a light-emitting optical path.

According to one embodiment, the package preparation method may further include disposing a second semiconductor chip at an outer side of the package.

A semiconductor package according to the present technology includes: a semiconductor chip; a mold configured to encapsulate the chip; a redistribution layer; and an optical device electrically connected to the chip through the redistribution layer, wherein the mold is formed with an optical path passing through the mold, and light is input to or output from the optical device through the optical path.

According to one embodiment, the optical path may be a hole bored in the mold.

According to one embodiment, the optical path may be formed by an optical path member which allows the light to pass therethrough.

According to one embodiment, the semiconductor package may further include an external connection terminal electrically connected to the redistribution layer.

According to one embodiment, the redistribution layer may include conductive patterns and an insulating layer configured to insulate the conductive patterns, and the conductive patterns may be formed to bypass the optical path.

According to one embodiment, the optical device may include a first surface connection terminal formed on a first surface facing the optical paths, and connected to the redistribution layer.

According to one embodiment, the optical device may further include a second surface connection terminal formed on a surface opposite the first surface, and the second surface connection terminal may be connected to the redistribution layer through wire bonding and a submount member.

According to one embodiment, the mold may further encapsulate a monitoring optical device and a monitoring optical device forming member forming input and output optical paths of the monitoring optical device.

According to one embodiment, the package may further include a second semiconductor chip located at an outer side of the package.

According to one embodiment, the package may include a plurality of optical devices.

According to one embodiment, each of the plurality of optical devices may include any one of a light-receiving device and a light-emitting device, and the optical paths may be formed so that one or more of the light-receiving device and the light-emitting device may correspond to a light-receiving optical path and a light-emitting optical path.

According to one embodiment, the package may further include an optical system configured to perform one or more functions of concentrating, dispersing, and collimating light.

According to one embodiment, the package may further include a second semiconductor chip exposed at an outer side of the mold, and electrically connected to the redistribution layer.

A package formed by the present technology has a thinner thickness than a semiconductor package according to the related art, and has an advantage in that components can be disposed closer and thus the performance of an optical device can be improved.

BRIEF DESCRIPTION OF THE DRAWINGS

FIG. 8, (a) to (c) are views showing connection examples of a light-receiving device and the redistribution layer.

FIG. 20, (a) and (b) are views showing other implementation examples of optical device semiconductor packages.

DETAILED DESCRIPTION

First Embodiment

Figure 1:
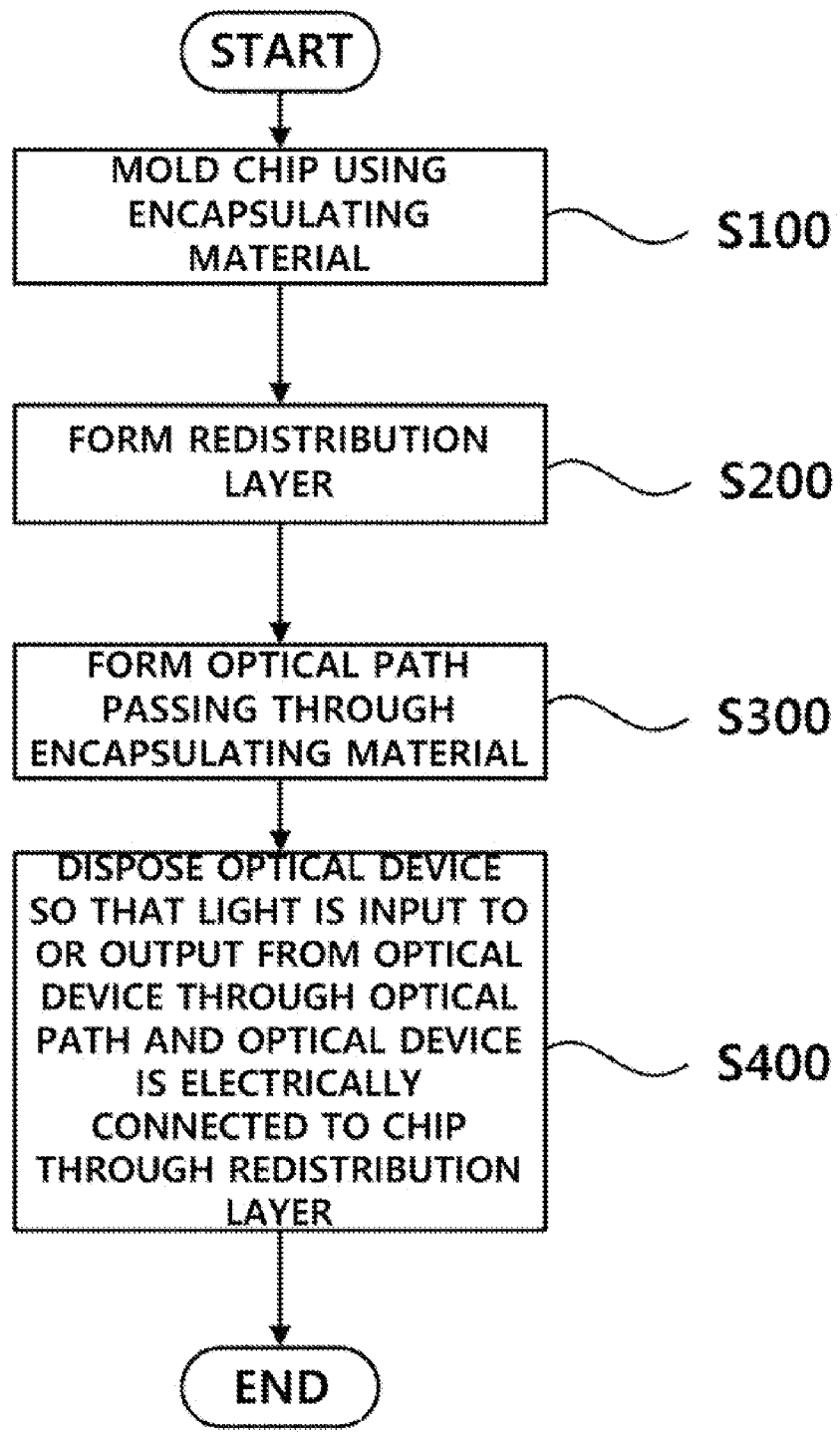
FIG. 1 is a flow chart showing an outline of a sensor package preparation method according to the embodiment.

Hereinafter, an optical device package preparation method according to the embodiment will be described with reference to the accompanying drawings. FIG. 1 is a flow chart showing an outline of a sensor package preparation method according to the embodiment. Referring to FIG. 1, the sensor package preparation method is a preparation method of a semiconductor package, and the package preparation method includes molding a chip using an encapsulating material (S100), forming a redistribution layer (S200), forming an optical path passing through the encapsulating material (S300), and disposing one or more optical devices to be electrically connected to the redistribution layer (S400), wherein the disposing of the optical device is performed so that light is input to or output from the optical device via the optical path.

Figure 2:
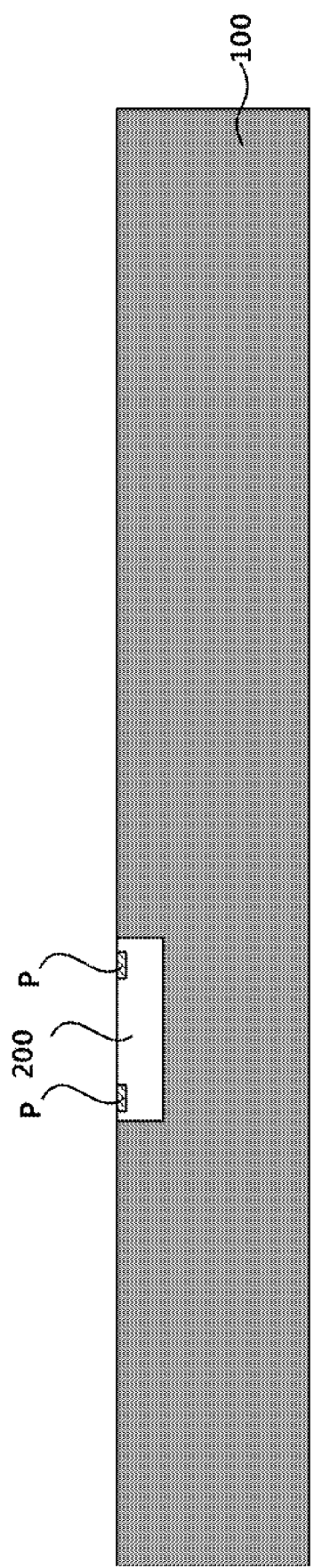
FIG. 2 is a view showing a state in which a chip is molded using an encapsulating material.

FIGS. 2 to 14 are exemplary process cross-sectional views of a preparation method of an optical device package 10 according to the embodiment. Referring to FIG. 2, a chip 200 is molded using the encapsulating material 100. The chip 200 may be an individualized chip of a semiconductor wafer, and is designed to perform a desired function. In one embodiment, as will be described below, the chip 200 may be designed to drive a light-emitting device 520 (see FIG. 6) to emit light or to process an electrical signal output by detecting light by a light-receiving device 510 (see FIG. 6). Further, the chip 200 may be driven so that the light-emitting device 520 (see FIG. 6) may emit light, and may perform functions of detecting the time until the light-receiving device 510 (see FIG. 6) receives light reflected from a target (not shown), and calculating a distance to the target (not shown) from the calculated time. As another example, the chip 200 may be a chip which interfaces, for example, data and/or power, with an external device (not shown). Further, the chip 200 may be a memory device, or a wired or wireless communication interface chip.

In one embodiment, after the chip 200 may be sealed and molded using the encapsulating material 200 after being disposed on a carrier substrate (not shown). In one embodiment, the encapsulating material 200 is a transparent mold of a light transmissive material through which light may be transmitted. In another embodiment, the encapsulating material 200 is an epoxy mold compound (EMC). The chip 200 molded using the encapsulating material 200 may be separated from the carrier substrate (not shown), and a pad P providing an electrical signal and/or power to a circuit (not shown) formed on the chip 200 may be exposed.

Figure 3:
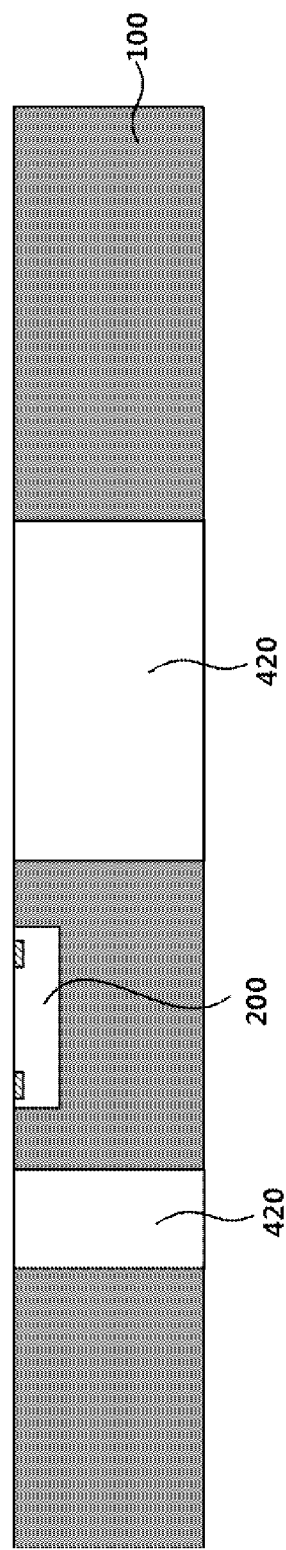
FIG. 3 is a view showing a state in which a redistribution layer is formed.

FIG. 3 is a view showing a state in which a sacrificial member 420 is molded together with the chip 200. Referring to FIG. 3, the sacrificial member (not shown) may be molded together with the chip 200 at a position where optical paths 400 (see FIG. 5) will be formed. The sacrificial member (not shown) is removed by a method such as laser boring, drilling, etching, or the like in a process of forming an optical path to form the optical path. The sacrificial member (not shown) may be formed of a soft material to facilitate laser boring and drilling, and may be formed of a material having a high etching rate with respect to an etchant so that etching may be easily performed.

Figure 4:
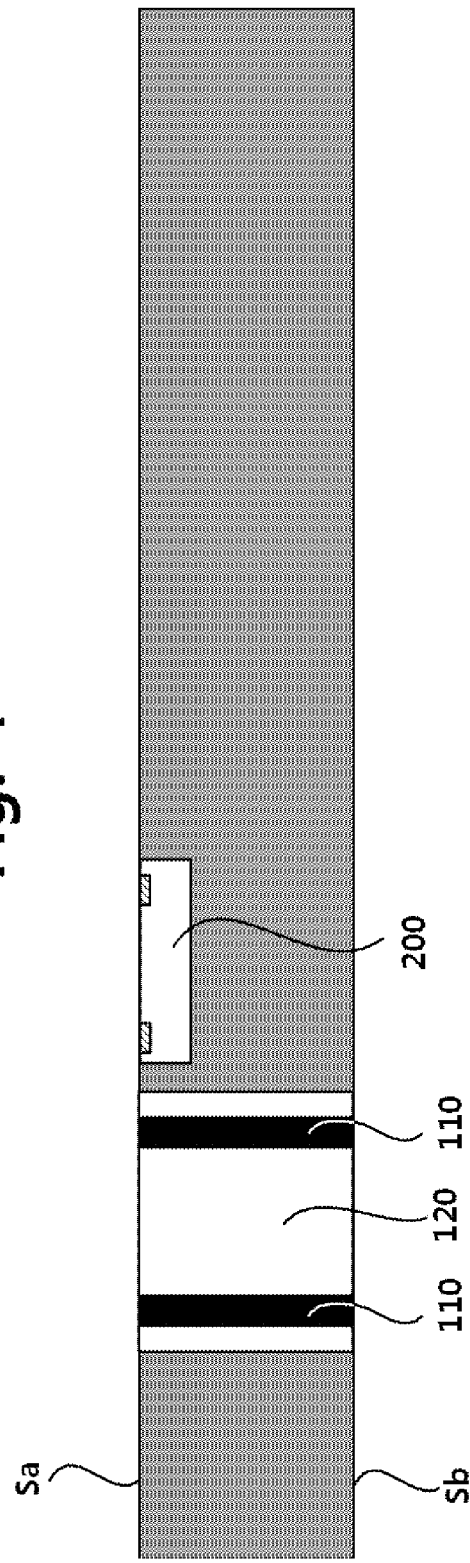
FIG. 4 is a view showing a state in which a through via member is molded with the chip.
Figure 14:
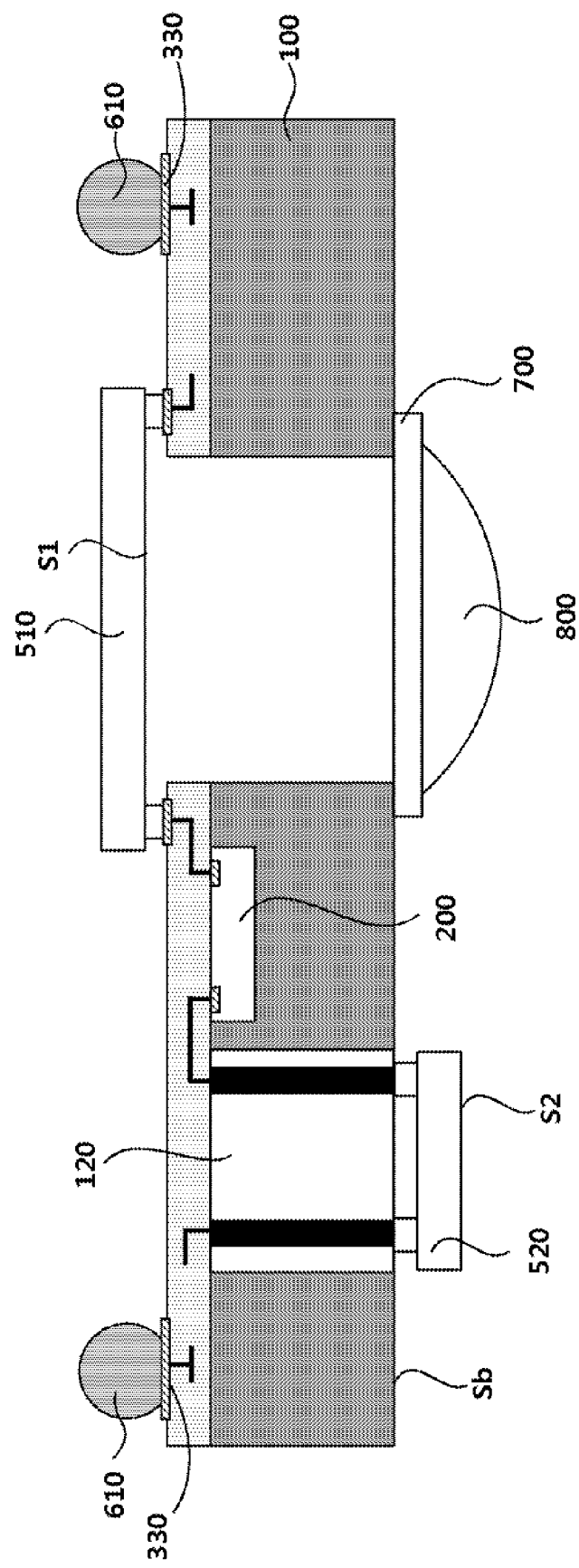
FIG. 14 is a view showing another embodiment of the optical device package preparation method.

FIG. 4 is a view showing a state in which a through via member 120 is molded with the chip 200. Referring to FIG. 4, the through via member 120 includes one or more through vias 110 forming a conductive path passing through first and second surfaces Sa and Sb of a mold 100. As in an embodiment to be described below, the through via 110 may electrically connect a semiconductor chip 520 (see FIG. 14) disposed on the second surface Sb of the mold 100 and a redistribution layer 300 (see FIG. 5). The embodiment illustrated in FIG. 14 illustrates the light-emitting device 520, but the through via 110 may electrically connect elements such as a semiconductor chip, a light-emitting device, and a light-receiving device to the redistribution layer 300.

The embodiment illustrated in FIG. 4 shows an example in which the through via 110 is formed by forming a hole passing through the through via member 120 and then filling a conductive material. In an embodiment not shown, the through via 110 may be formed by forming a hole passing through the through via member 120 and then forming a conductive material on a sidewall of the hole.

Figure 5:
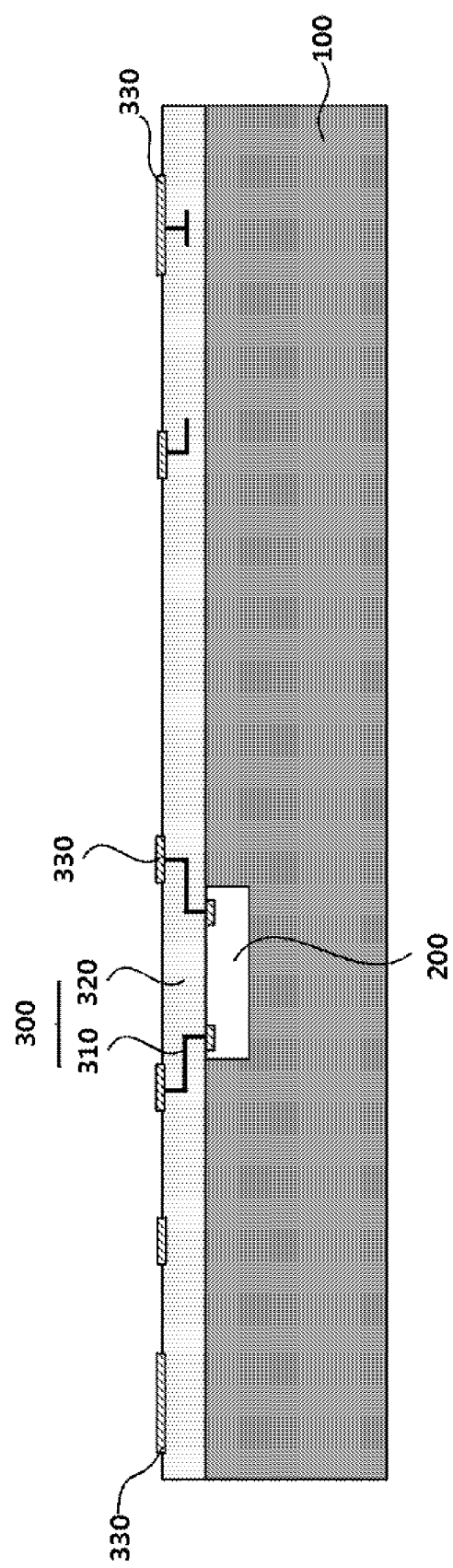
FIG. 5 is a view showing a state in which a redistribution layer is formed.

FIG. 5 is a view showing a state in which the redistribution layer 300 is formed. Referring to FIG. 5, the redistribution layer (RDL) 300 is formed on the mold 300 to be electrically connected to the pad P formed on the chip 200. In one embodiment, the redistribution layer 300 may include conductive patterns 310 which perform electrical connection and an insulating layer 320 which insulates the conductive patterns 310. Further, the conductive pattern 310 may be formed to connect external connection terminals (610—see FIG. 9, 620—see FIG. 10, and 330) to be formed later to the chip 200, or electrically connect the external connection terminals (610—see FIG. 9, 620—see FIG. 10, and 330) and elements to be formed below such as optical devices 510 and 520 and the like.

For example, the redistribution layer 300 may be formed by forming the insulating layer 320 to insulate the conductive patterns 310 after forming the conductive patterns 310 connected to the pads by forming the insulating layer 320 which insulates the exposed chip, opening the pad so that the target pad P is exposed, and then performing plating. In one embodiment, the conductive patterns 310 may be formed of any one of copper, aluminum, and gold, and the insulating layer 320 may be formed of any one of a polyimide layer, a polymer layer, and an oxide film layer.

In one embodiment, pads 330 connected to the optical devices 510 and 520 and a second semiconductor chip 210 (see FIG. 14) may be formed on the redistribution layer 300. Further, an external connection terminal 610 such as a conductive bump, a solder ball, or the like may be formed on the pad 330, and the pad 330 may be electrically connected to a terminal such as a conductive bump, a solder ball, or the like formed in an external device (not shown) to function as an external connection terminal, or may function as an external connection terminal alone.

In one embodiment, in the forming of the redistribution layer 300, the conductive pattern 310 may be formed to bypass the optical paths 400 to be formed in a process to be described below. The conductive pattern 310 may be formed with a width and a thickness capable of acquiring good conductivity, and in order to prevent the blocking of light input to or output from the optical paths 400, the conductive pattern 310 may be formed by bypassing the optical path 400.

Figure 6:
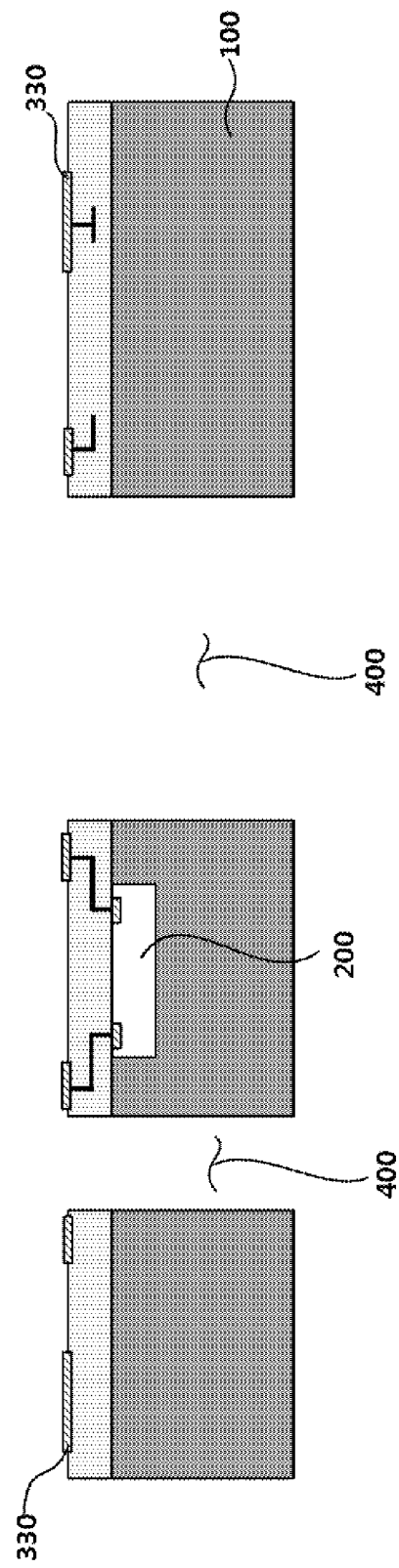
FIG. 6 is a view showing a state in which optical paths are formed.

FIG. 6 is a view showing a state in which the optical paths 400 are formed. Referring to FIG. 6, the optical paths 400 passing through the mold 200 are formed. For example, the optical paths 400 may be formed to pass through the mold 200 so that light may be input to and/or output from an optical device to be described later. A process of forming the optical paths may be performed by a method such as laser boring, drilling, etching, or the like, but is not limited thereto. As described above, the process of forming the optical paths 400 may be performed by removing the sacrificial member (not shown).

In one embodiment, the through via 110 may be further formed through the mold 100. The through via 110 passing through the mold may be formed by forming a hole passing through the mold 100 by a method such as such as laser boring, drilling, etching, or the like, and filling the inside of the hole with a conductive material or coating the wall surface of the hole with a conductive material. In an embodiment to be described later, the through via 110 may electrically connect the optical device and the semiconductor chip disposed on the second surface of the mold 200.

Figure 7:
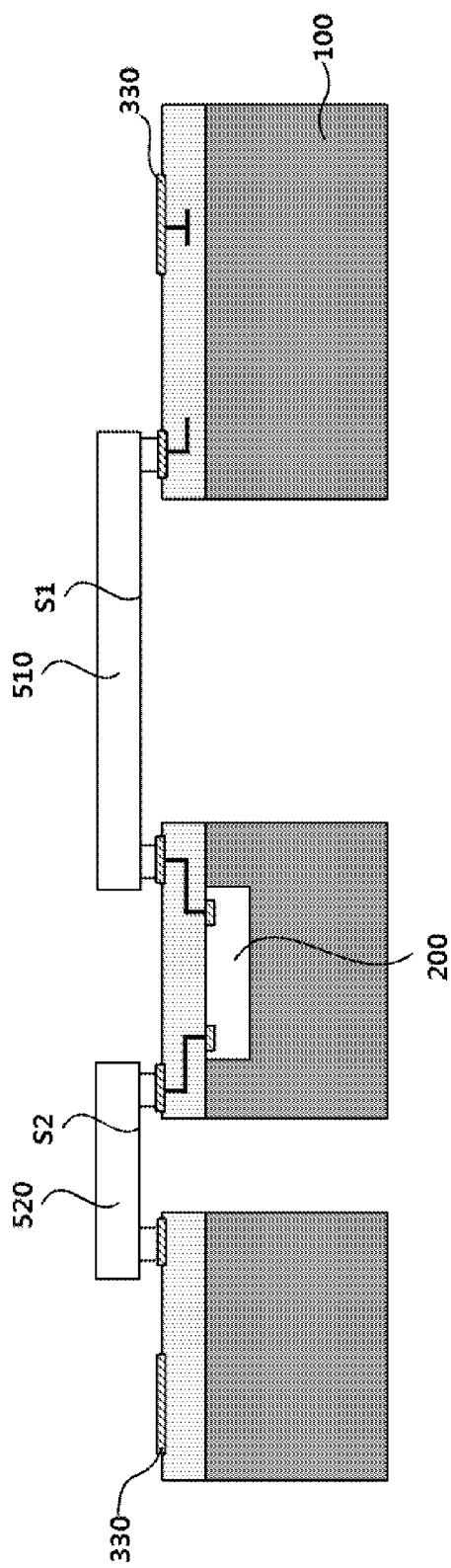
FIG. 7 is a view showing a state in which optical devices are disposed.

FIG. 7 is a view showing a state in which the optical devices 510 and 520 are disposed. Referring to FIG. 7, the optical devices 510 and 520 are disposed to be electrically connected to the redistribution layer 300. In one embodiment, the optical devices 510 and 520 may be any one of the light-receiving device 510 and the light-emitting device 520 or the other of the light-receiving device 510 and the light-emitting device 520. The light-receiving device 510 is disposed so that light input through the optical paths 400 is provided to a light-receiving surface 51 of the light-receiving device 510. The light-emitting device 520 is disposed so that light provided from a light-emitting surface S2 is provided to the outside through the optical paths 400. Further, since the optical devices 510 and 520 are disposed to be electrically connected to the redistribution layer 300, an electrical signal is input to or output from the redistribution layer 300.

FIG. 8, (a) to (c) are views showing connection examples of the light-receiving device 510 and the redistribution layer 300. Referring to FIG. 8, (a), a conductive bump 512 may be formed on the light-receiving surface 51 of the light-receiving device 510, and the conductive bump 512 may be connected by coming into contact with the pad 330 formed on the redistribution layer 300.

Referring to FIG. 8, (b), a pad 514 may be formed on a second surface S3 of the light-receiving device 510, and the pad 514 may be electrically connected to the pad 330 formed on the redistribution layer 300 through a submount member S. In one embodiment, a surface of the submount member S may be coated with a conductive material (a thick solid line).

The conductive material of the submount member S, the pad 330 formed on the redistribution layer and the conductive material, and the pad 514 formed on the light-receiving device 510 may each be connected with a conductive adhesive. For example, the conductive adhesive may be any one of a silver-epoxy paste in which silver particles are dispersed in epoxy, gold-tin by which eutectic bonding is performed between the pad and the conductive material, and an anisotropic conductive film. Referring to FIG. 8, (c), the pad 514 formed on the second surface S3 of the light-receiving device 510 may be connected to the pad 330 formed on the redistribution layer 300 through wire bonding.

FIG. 8, (a) to (c) show the connection between the light-receiving device 510 and the redistribution layer 300, but these are only examples, and the light-emitting device 520 and another semiconductor chip may also be connected to the redistribution layer 300 through the described examples.

Figure 9:
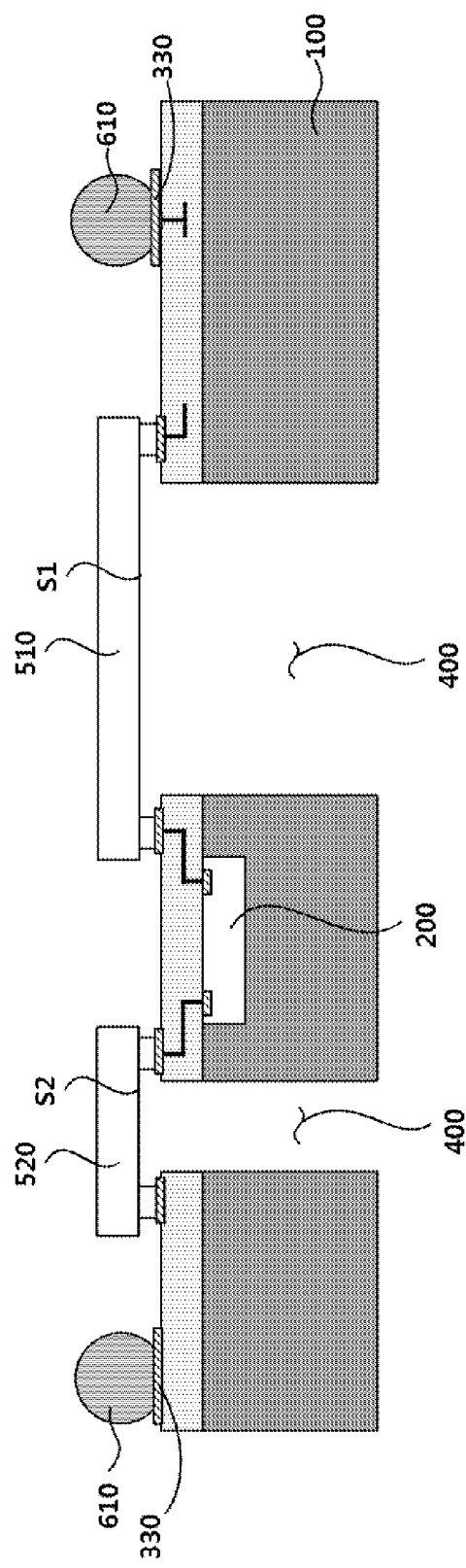
FIG. 9 is a view in which a solder ball is an external connection terminal.

The optical device package preparation method according to the embodiment may further including forming an external connection terminal. As shown in FIG. 9, the external connection terminal may be a solder ball 610. The solder ball 610 may form, for example, a ball grid array (BGA). For example, the solder ball 610 may be formed by forming a seed layer (not shown) for plating the pad 330 formed on the redistribution layer 300, performing the plating to form a solder material such as tin, silver, or the like, and performing reflow.

Figure 10:
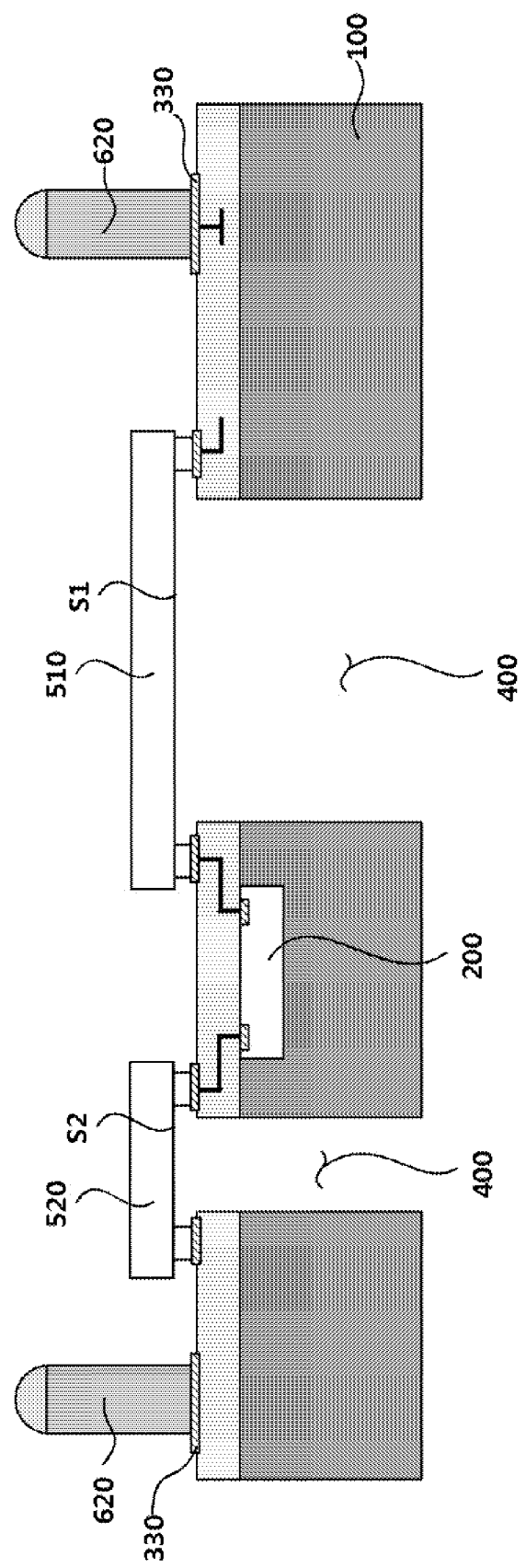
FIG. 10 is a view in which a conductive bump is an external connection terminal.

In the embodiment illustrated in FIG. 10, the external connection terminal may be a conductive bump 620. For example, the conductive bump 620, for example, may be formed by forming a seed layer (not shown) on the pad 330 formed on the redistribution layer 300, performing plating to form a conductive bump such as copper or the like, forming a solder material such as tin, silver, or the like on the bump, and performing reflow.

In one embodiment, the external connection terminal may be the pad 330 connected to the conductive pattern 310. The pad 330 may be connected to a connection terminal such as a bump, a solder ball, or the like formed in an external device (not shown), and as another example, may be connected to the external device (not shown) through wire bonding.

Hereinafter, an example in which the external connection terminal is formed as the solder ball 610 will be described. This is provided for easy understanding and description of the present invention, and is not intended to limit the scope of the present invention.

The optical device package preparation method according to the embodiment may further include filling optical paths 400 with an optically transparent material to prevent the introduction of foreign substances through the optical paths 400. In one embodiment, the optically transparent material may be any one of transparent epoxy, a transparent epoxy mold compound (EMC), glass, and quartz.

Figure 11:
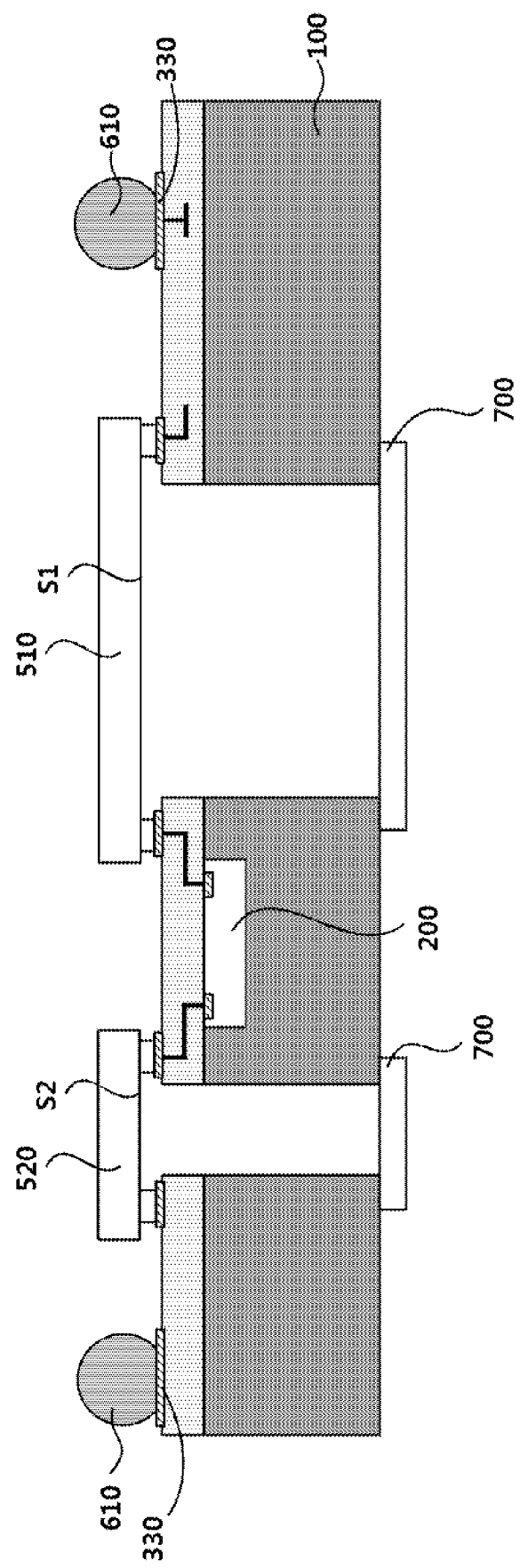
FIG. 11 is a view illustrating a state in which a passivation member is formed.

FIG. 11 is a view illustrating a state in which a passivation member 700 is formed. Referring to FIG. 11, the optical device package preparation method may further include forming the passivation member 700 capable of preventing the introduction of the foreign substances through the optical paths 400. The passivation member 700 may be formed to have a size at least as large as the size of an opening of the optical path. The passivation member 700 may be formed of a transparent material so that the light passing through the optical paths 400 may not be affected, and may be formed of, for example, glass. The embodiment illustrated in FIG. 11 illustrates forming the passivation member 700 for each optical path 400, but according to an embodiment not shown, a single passivation member 700 may be formed to block the openings of a plurality of optical paths.

Figure 12:
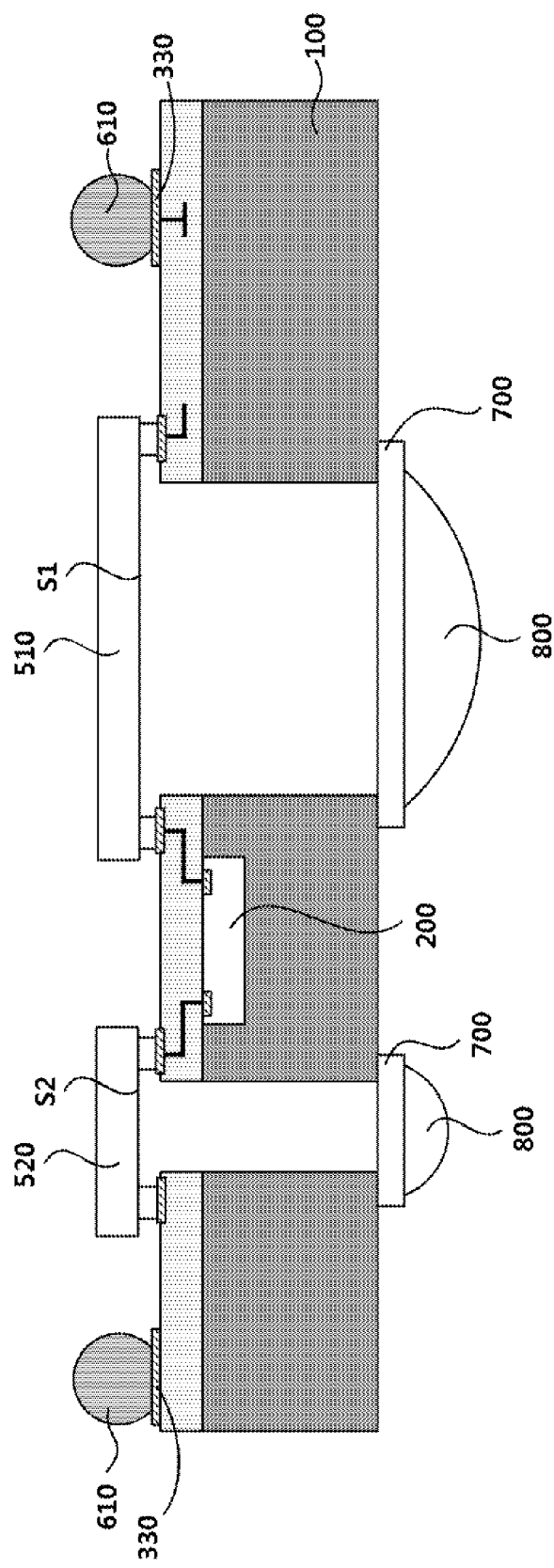
FIG. 12 is a view illustrating a state in which an optical system is formed.

FIG. 12 is a view illustrating a state in which an optical system 800 is formed. Referring to FIG. 12, the optical device package preparation method may further include forming the optical system 800 including lenses which perform one or more functions of concentrating, dispersing, and collimating light provided through the optical path 400. The embodiment illustrated in FIG. 12 illustrates that the optical system 800 is formed on the passivation member 700, but according to an embodiment not shown, the optical system 800 may be directly formed on the optical path 400.

Figure 13:
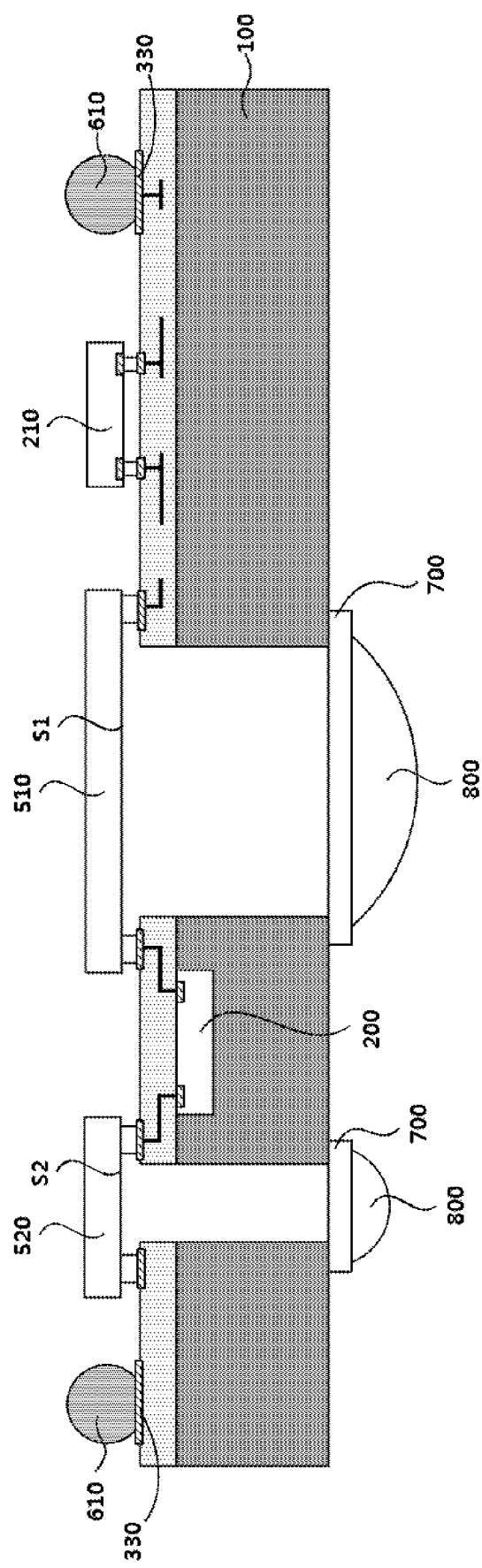
FIG. 13 is a view illustrating a state in which a second semiconductor chip is formed.

FIG. 13 is a view illustrating a state in which a second semiconductor chip 210 is formed. Referring to FIG. 13, the second semiconductor chip 210 may be formed on the redistribution layer 300. In one embodiment, the second semiconductor chip 210 may be a chip which controls the optical devices 510 and 520. As another embodiment, the second semiconductor chip 210 may be a microcontroller chip including an arithmetic unit, and may be a chip which calculates a time difference between the time at which the light-emitting device 520 provides light to a target and the time at which the light-receiving device 510 receives the light reflected from the target to calculate a distance to the target. As still another embodiment, the second semiconductor chip 210 may be a chip which interfaces, for example, data and/or power, with an external device (not shown).

FIG. 14 is a view showing another embodiment of the optical device package preparation method. Referring to FIG. 14, elements connected to the through via 110 may be disposed on the second surface Sb of the package. FIG. 14 illustrates an embodiment in which the light-emitting device 520 is disposed on the second surface of the package. The light-emitting device 520 is disposed so that the light-emitting surface S2 is exposed to provide light to the outside without passing through the optical paths passing through the mold 100. As in the illustrated embodiment, the light-emitting device 520 is disposed so that the connection terminal is connected to the through via 110.

FIG. 14 illustrates a configuration in which the light-emitting device 520 is disposed on the second surface of the mold 100, but in another embodiment not shown, the light-receiving device 510 and the semiconductor chip 200 are located on the second surface of the mold to be electrically connected to the through via 110.

Second Embodiment

Figure 15:
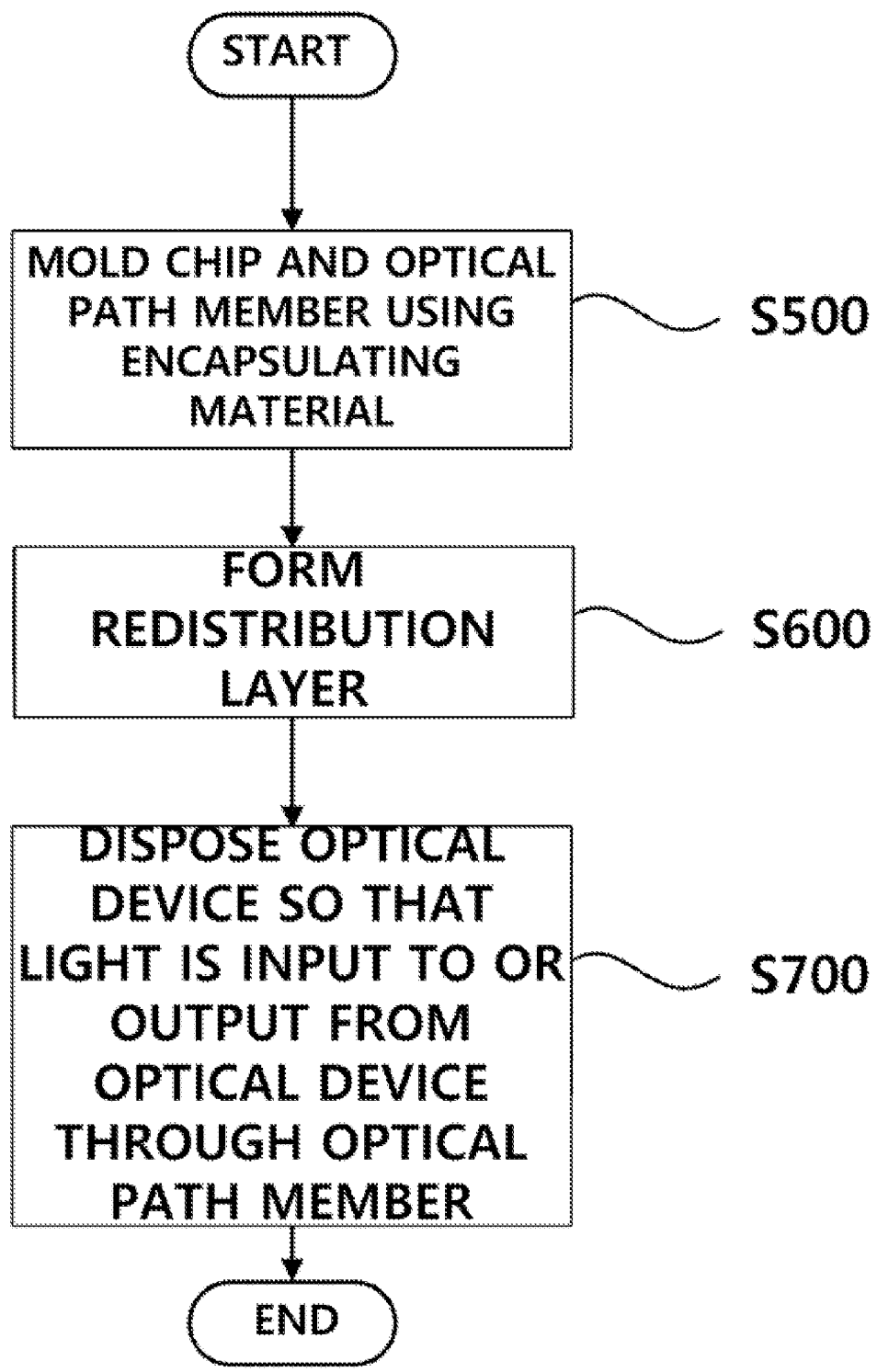
FIG. 15 is a flow chart schematically showing an optical device package preparation method according to the embodiment.

Hereinafter, an optical device package preparation method according to the embodiment will be described with reference to FIGS. 15 to 18. For concise and clear description of the present invention, descriptions of elements the same as or similar to the above-described embodiment may be omitted. FIG. 15 is a flow chart schematically showing an optical device package preparation method according to the embodiment. Referring to FIG. 15, the optical device package preparation method includes molding a chip and an optical path member using an encapsulating material (S500), and forming a redistribution layer and disposing an optical device to be electrically connected to the chip through the redistribution layer (S600), wherein the disposing of the optical device is performed so that light is input to or output from the optical device through the optical path member.

Figure 16:
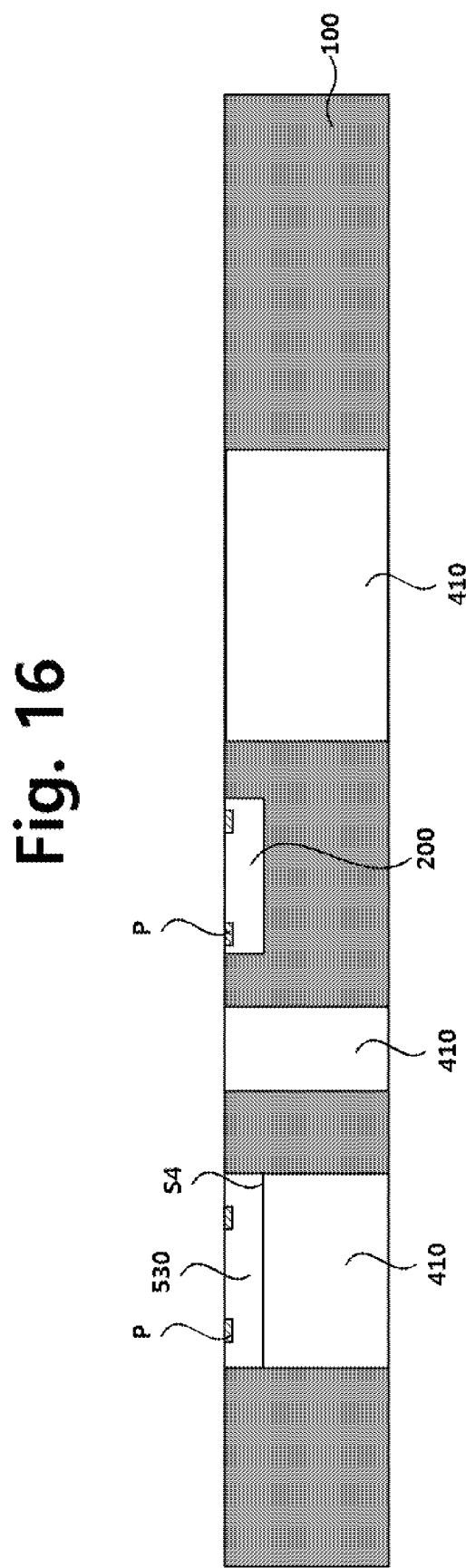
FIG. 16 illustrates a state in which a chip and optical path members are molded using an encapsulating material.

FIG. 16 illustrates a state in which a chip 200 and optical path members 410 are molded using the encapsulating material. Referring to FIG. 16, the chip 200 and the optical path members 410 disposed on a carrier substrate (not shown) are molded using the encapsulating material. In one embodiment, a monitoring optical device 530 which monitors light emitted from a light-emitting device 520 and the optical path members 410 forming optical paths of the light provided to the monitoring optical device 530 may be molded together. When the monitoring optical device 530 and the optical path members 410 are molded, the monitoring optical device 530 and the optical path members 410 may be formed to be laminated so that light may be input to or output from a light-emitting surface or a light-receiving surface S4 of the monitoring optical device 530 through the optical path members 410.

FIG. 16 illustrates an example in which a single monitoring optical device 530 is molded, but in an embodiment not shown, the monitoring optical device 530 may include both a monitoring light-receiving device which monitors the light provided to the light-receiving device 510 and a monitoring light-emitting device which monitors the light provided from the light-emitting device. Further, the through via member 120 in which the through via 110 is formed may be further molded together with the chip 200 and the optical path members 410 (see FIG. 4).

The optical path members 410 may transmit light through the mold and may have an optically transparent material. In one embodiment, the optical path members 410 may be formed of any one of transparent epoxy, a transparent EMC, glass, and quartz.

The redistribution layer 300 is formed (S600). In one embodiment, the redistribution layer 300 is formed so that the pads P of the chip 200 exposed through the mold 100 and the conductive patterns 310 are electrically connected. Further, the redistribution layer 300 is formed to be electrically connected to pads P of the monitoring optical device 530. As described above, the redistribution layer 300 may be formed by forming the insulating layer 320 to insulate the conductive patterns 310 after forming the conductive patterns 310 connected to the pads by forming the pads P and the insulating layer 320 which insulates the exposed pads P, opening the pad so that the target pad P is exposed, and then performing plating.

As described above, since the conductive pattern 310 may have a sufficient width and thickness to provide good conductivity, and thus may affect the propagation of light, the conductive pattern 310 is formed to bypass the optical path member 410.

In one embodiment, the pads 330 electrically connected to the conductive patterns 310 may be formed on the redistribution layer 300. As described above, the pads 330 may be electrically connected to the optical devices 510 and 520, external connection terminals 610 and 620, and/or the second semiconductor chip 210 through the conductive patterns 310.

In one embodiment, the insulating layer 300 corresponding to the optical path members 410 is removed. When the insulating layer is formed to cover the optical path members 410, since the transmittance of light through the optical path members 410 may decrease, the insulating layer 320 corresponding to the optical path members 410 may be removed.

In another embodiment, when the insulating layer 300 is optically transparent, the insulating layer 320 may not be removed.

Figure 17:
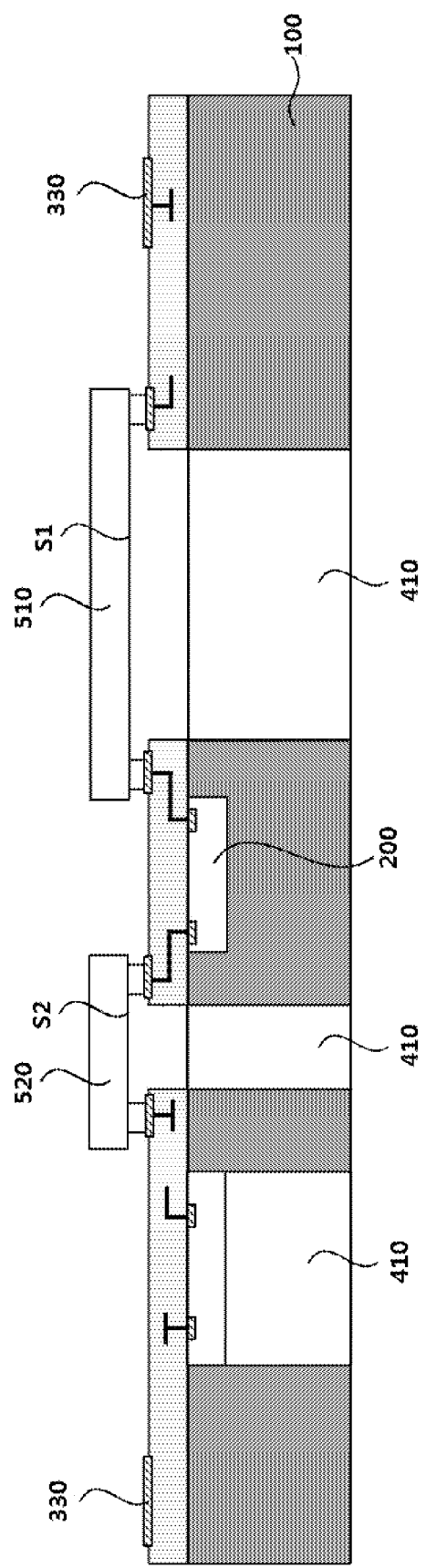
FIG. 17 is a view illustrating a state in which optical devices are disposed.

FIG. 17 is a view illustrating a state in which the optical devices 510 and 520 are disposed. Referring to FIG. 17, the light-receiving device 510 is disposed so that the light provided through the optical path members 410 is provided to a light-receiving surface 51 of the light-receiving device 510. Further, the light-emitting device 520 is disposed so that the light provided from a light-emitting surface S2 of the light-emitting device 520 is provided through the optical path members 410.

According to an embodiment not shown, the second semiconductor chip 210 (see FIG. 13) may be disposed. As described above, the second semiconductor chip 210 (see FIG. 13) may be a chip which controls one or more of the light-receiving device 510, the light-emitting device 520, and the monitoring optical device 530. As another example, the second semiconductor chip 210 (see FIG. 13) may be a chip which receives signals from the light-receiving device 510, the light-emitting device 520, and the monitoring optical device 530 and processes the signals, or which interfaces data and/or power with an external device (not shown).

As in the illustrated embodiment, the light-receiving device 510 and the light-emitting device 520 may be connected to the pads 330 through a conductive bump, or may be electrically connected to the pads 330 through the submount member S (see FIG. 8. (b)) or wire bonding (see FIG. 8, (c)).

Figure 18:
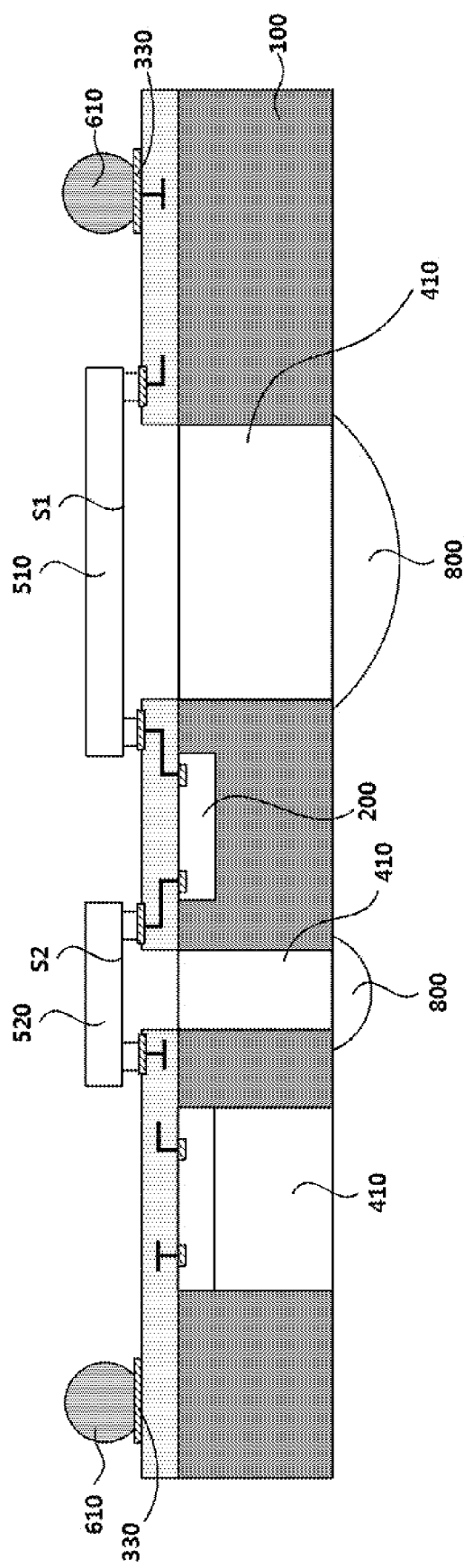
FIG. 18 is a view illustrating a state in which external connection terminals and an optical system are formed.

FIG. 18 is a view illustrating a state in which the external connection terminals and the optical system 800 are formed. Referring to FIG. 18, the external connection terminal may be a solder ball 610 as illustrated, or may be a conductive bump 620 as illustrated in FIG. 10. In another embodiment, the pad 330 formed on the redistribution layer 300 may be connected to a connection terminal such as a conductive bump, a solder ball, or the like formed in the external device (not shown) to function as an external connection terminal, or may be connected to the external device (not shown) through wire bonding (see FIG. 8, (c)) to perform a function of the external connection terminal.

The optical system 800 concentrates, disperses, or collimates the light input or output through the light-receiving device 510 and the light-emitting device 520. In one embodiment, the optical system 800 may include one or more lenses. For example, the optical system 800 may be formed on the passivation member 700 (see FIG. 11).

Third Embodiment

Figure 19:
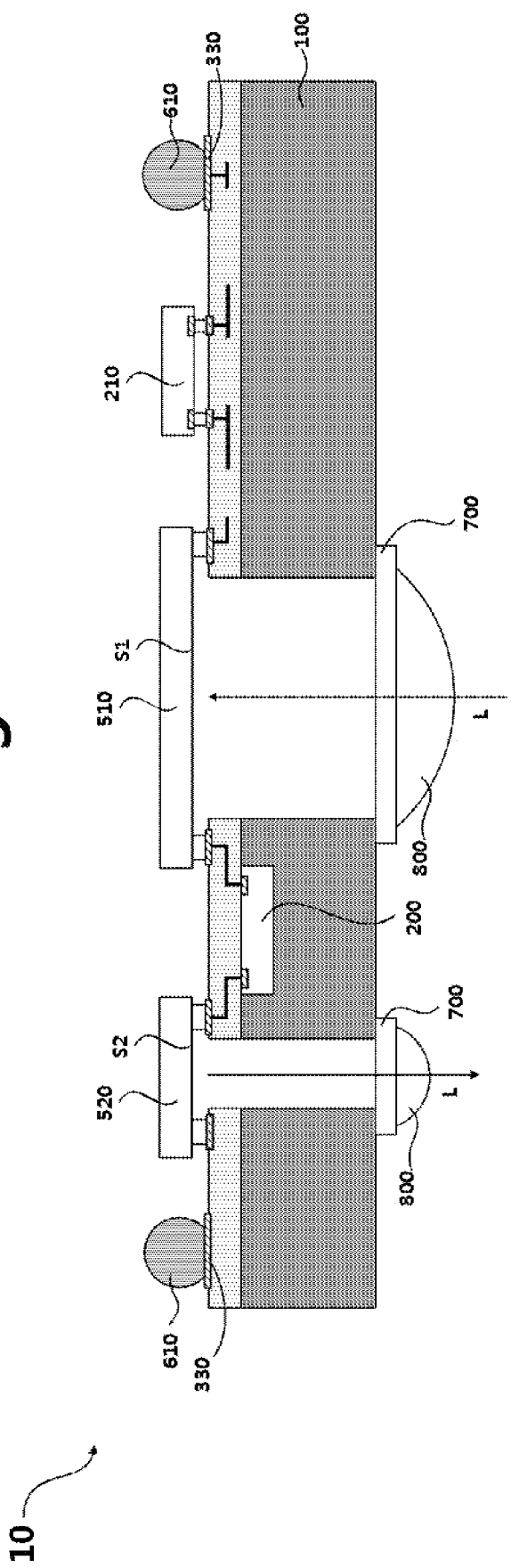
FIG. 19 is a cross-sectional view showing an outline of an optical device semiconductor package according to the embodiment.

Hereinafter, optical device semiconductor packages according to the embodiment will be described with reference to FIGS. 19 and 20. However, for concise and clear description, descriptions of elements the same as or similar to elements of the above-described embodiment may be omitted. FIG. 19 is a cross-sectional view showing an outline of an optical device semiconductor package 10 according to the embodiment. Referring to FIG. 19, the optical device semiconductor package 10 according to the embodiment includes a semiconductor chip 200, a mold 100 which encapsulates the chip 200, a redistribution layer 300 electrically connected to the chip 200, and optical devices 510 and 520 electrically connected to the chip 200 through the redistribution layer 300, wherein the mold 100 is formed with optical paths L passing through the mold, and light is input to or output from the optical devices 510 and 520 through the optical paths L.

In one embodiment, the light-emitting device 520 may be any one of a vertical cavity surface emitting laser (VCSEL) and a light-emitting diode (LED), and may provide light in a wavelength range such as infrared light, visible light, ultraviolet light, or the like. Further, the light-emitting device 510 may output laser light in a target wavelength range. In one embodiment, the light-receiving device 510 may be an optical device which detects the light in the target wavelength range, and may be any one of a photodiode (PD), a complementary metal-oxide semiconductor (CMOS) image sensor (CIS), and a single photon avalanche diode (SPAD).

FIG. 20, (a) is one implementation example of the optical device semiconductor package 10. Referring to FIG. 19 and FIG. 20, (a), the optical device semiconductor package 10 may be used to measure a distance to a target T. The light-emitting device 510 receives a driving signal and/or power from the chip 200 and provides light.

The light provided by the light-emitting device 510 proceeds along the optical paths L passing through the mold. In one embodiment, a second surface S2 of the mold includes an optical system 800 which performs one or more functions of concentrating, dispersing, and collimating the light provided by the light-emitting device 520, and the light provided by the light-emitting device 520 is provided to the target T via the optical system 800. The light is reflected from the target T and provided to the light-receiving device through the optical paths L. The light which passed through the optical system 800 is input to a light-receiving surface S2 of the light-receiving device 520.

The semiconductor chip 200 drives the light-emitting device 520 so that the light-emitting device 520 outputs light, and receives an electrical signal corresponding to the light detected by the light-receiving device 510. The semiconductor chip 200 may calculate a time difference (Time of Flight) (TOF) between the time at which the light-emitting device 510 outputs light and the time at which the light-receiving device 520 detects light, and calculate a distance corresponding to the time difference. The calculated distance corresponds to a distance between the optical device semiconductor package 10 and the target T. The calculated time difference or distance may be provided to an external device (not shown) through an external connection terminal 610.

FIG. 20, (b) is another implementation example of the optical device semiconductor package according to the embodiment. Referring to FIG. 19 and FIG. 20, (b), an optical device semiconductor package 11 includes a light-emitting device 520 and an optical device semiconductor package 12 includes a light-receiving device 510. The optical device semiconductor package 11 and the optical device semiconductor package 12 may operate in synchronization.

The optical device semiconductor packages 11 operating in synchronization provide light, and provides a time for providing light to the external device (not shown). The light reflected from the target T is provided to the optical device semiconductor package 12, and the optical device semiconductor package 12 which received the reflected light provides the time at which the light is received to the external device (not shown). The external device (not shown) may calculate a difference between the time at which the light is provided and the time at which the light is received, and calculate a distance between the target T and each of the optical device semiconductor packages 11 and 12.

As another example, the optical device semiconductor package 11 and the optical device semiconductor package 12 may be connected to each other through the external connection terminal. The time difference and the distances may be calculated through semiconductor chips located in the optical device semiconductor package 11 and the optical device semiconductor package 12.

Fourth Embodiment

Figure 21:
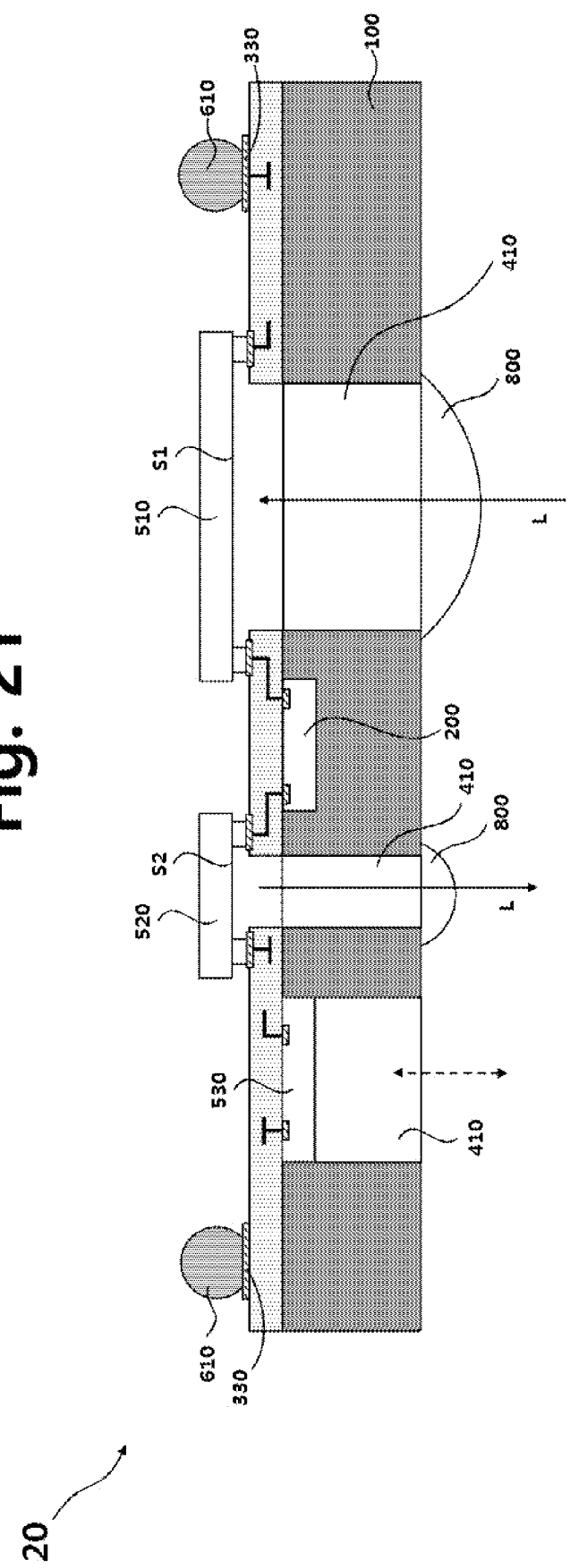
FIG. 21 is a cross-sectional view showing an outline of an optical device semiconductor package according to the embodiment.

Hereinafter, an optical device semiconductor package according to the embodiment will be described with reference to FIG. 21. However, for concise and clear description, descriptions of elements the same as or similar to elements of the above-described embodiment may be omitted. FIG. 21 is a cross-sectional view showing an outline of an optical device semiconductor package according to the embodiment. Referring to FIG. 21, in the optical device semiconductor package 10 according to the embodiment, optical paths L passing through a mold 100 may be formed, and light provided to a light-receiving device 510 and light provided by a light-emitting device 520 may be provided through optically transparent optical path members 410 (see FIG. 16).

In one embodiment, a monitoring optical device 530 may monitor the light provided by the light-emitting device 520. For example, the light provided by the light-emitting device 520 and the light received by the light-receiving device 510 need to be detected for reasons such as breakdown of the light-emitting device 520, breakdown of the light-receiving device 510, breakdown of an optical system 800, unintentional separation of the optical system 800 and/or a passivation member 700, introduction of foreign substances through optical paths 400, or the like.

The monitoring optical device 530 may detect the light provided by the light-emitting device 520 to detect whether the light-emitting device 520 is malfunctioning, and detect the light together with the light-receiving device 520 to detect whether the light-receiving device 510 is malfunctioning.

The monitoring optical device 530 may be a light-emitting device, and may provide light instead of the malfunctioning light-emitting device 520 when the light-emitting device 520 malfunctions.

Although the embodiments shown in the drawings are described as a reference for helping understanding of the present invention, these are embodiments for implementation, and merely exemplary, and various modifications and equivalents may be performed by those skill in the art. Accordingly, the true technical scope of the present invention should be defined by the appended claims.

The invention claimed is:

1. A semiconductor package comprising:
   a semiconductor chip;
   a mold configured to encapsulate the semiconductor chip;
   a redistribution layer; and
   an optical device electrically connected to the semiconductor chip through the redistribution layer,
   wherein the mold is formed with an optical path passing through the mold, and light is input to or output from the optical device through the optical path,
   wherein the mold includes a first surface and a second surface opposite to the first surface,
   wherein the optical path extends through the mold from the first surface to the second surface, and
   wherein the optical device receives or emits the light through the optical path extending through the mold.

2. The package of claim 1, wherein the optical path is a hole bored in the mold.

3. The package of claim 1, wherein the optical path is formed by an optical path member which allows the light to pass therethrough.

4. The package of claim 1, further comprising an external connection terminal electrically connected to the redistribution layer.

5. The package of claim 1, wherein:
the redistribution layer includes conductive patterns and an insulating layer configured to insulate the conductive patterns; and
the conductive patterns are formed to bypass the optical path.

6. The package of claim 1, wherein the optical device includes a first optical surface connection terminal formed on a first optical surface facing the optical path, and connected to the redistribution layer.

7. The package of claim 6, wherein:
the optical device further includes a second optical surface connection terminal formed on a surface opposite the first optical surface; and
the second optical surface connection terminal is connected to the redistribution layer through wire bonding and a submount member.

8. The package of claim 1, further comprising a through via configured to electrically connect the first surface of the mold and the second surface.

9. The package of claim 1, further comprising one or more of the optical device and the semiconductor chip electrically connected to a through via.

10. The package of claim 1, comprising a plurality of optical devices.

11. The package of claim 10, wherein:
each of the plurality of optical devices includes any one of a light-receiving device and a light-emitting device; and
the optical paths are formed so that one or more of the light-receiving device and the light-emitting device corresponds to a light-receiving optical path and a light-emitting optical path.

12. The package of claim 1, further comprising an optical system configured to perform one or more functions of concentrating, dispersing, and collimating light.

13. The package of claim 1, further comprising a second semiconductor chip exposed at an outer side of the mold and electrically connected to the redistribution layer.

14. The package of claim 1, wherein:
the optical device is a light-receiving device
the light-receiving device is one of a photodiode (PD), a complementary metal-oxide semiconductor (CMOS) image sensor (CIS), and a single photon avalanche diode (SPAD).

15. The package of claim 1, wherein:
the optical device is a light-emitting device; and
the light-emitting device is one of a vertical cavity surface emitting laser (VCSEL) and a light-emitting diode (LED).

16. A semiconductor package comprising:
a semiconductor chip;
a mold configured to encapsulate the semiconductor chip;
a redistribution layer; and
an optical device electrically connected to the semiconductor chip through the redistribution layer,
wherein the mold is formed with an optical path passing through the mold, and light is input to or output from the optical device through the optical path,
wherein the mold further encapsulates a monitoring optical device and a monitoring optical device optical path forming member forming input and output optical paths of the monitoring optical device.

* * * * *